United States Patent
Yih et al.

(10) Patent No.: US 8,097,912 B2
(45) Date of Patent: Jan. 17, 2012

(54) SYSTEMS AND METHODS FOR SELF CONVERGENCE DURING ERASE OF A NON-VOLATILE MEMORY DEVICE

(75) Inventors: Cheng-Ming Yih, Hsinchu (TW); Chu-Ching Wu, Hsinchu (TW); Huei-Huarng Chen, Hsinchu (TW)

(73) Assignee: Macronix International Co. Ltd. (TW)

( * ) Notice: Subject to any disclaimer, the term of this patent is extended or adjusted under 35 U.S.C. 154(b) by 1252 days.

(21) Appl. No.: 11/762,677

(22) Filed: Jun. 13, 2007

(65) Prior Publication Data

US 2008/0308857 A1 Dec. 18, 2008

(51) Int. Cl.
*H01L 21/8247* (2006.01)
*H01L 29/788* (2006.01)

(52) U.S. Cl. ........... 257/321; 257/E21.68; 257/E29.304; 257/E29.306; 438/257; 438/594

(58) Field of Classification Search .................. 257/315, 257/316, 321, E21.68, E29.3, E29.302, E29.304, 257/E29.305, E29.306; 438/201, 211, 257, 438/593, 594
See application file for complete search history.

(56) References Cited

U.S. PATENT DOCUMENTS

| | | | |
|---|---|---|---|
| 5,267,194 A | 11/1993 | Jang | |
| 5,625,600 A | 4/1997 | Hong | |
| 6,169,693 B1 | 1/2001 | Chan et al. | |
| 7,068,544 B2 * | 6/2006 | Forbes et al. | 365/185.33 |
| 7,075,829 B2 * | 7/2006 | Forbes | 365/185.28 |
| 7,166,886 B2 * | 1/2007 | Forbes | 257/315 |
| 7,187,587 B2 * | 3/2007 | Forbes | 365/185.23 |
| 7,545,674 B2 * | 6/2009 | Forbes et al. | 365/185.05 |
| 7,880,215 B2 * | 2/2011 | Watanabe et al. | 257/314 |
| 2003/0011017 A1 | 1/2003 | Lee et al. | |
| 2003/0042532 A1 * | 3/2003 | Forbes | 257/316 |
| 2006/0110870 A1 | 5/2006 | Bhattacharyya | |
| 2006/0274580 A1 * | 12/2006 | Forbes | 365/185.18 |
| 2007/0048923 A1 * | 3/2007 | Forbes et al. | 438/201 |

* cited by examiner

*Primary Examiner* — Anh Phung
*Assistant Examiner* — Michael Lulis
(74) *Attorney, Agent, or Firm* — Baker & McKenzie LLP

(57) ABSTRACT

A non-volatile memory device implements self-convergence during the normal erase cycle through control of physical aspects, such as thickness, width, area, etc., of the dielectric layers in the gate structure as well as of the overall gate structure. Self-convergence can also be aided during the normal erase cycle by ramping the erase voltage applied to the control gate during the erase cycle.

20 Claims, 5 Drawing Sheets

SYSTEMS AND METHODS FOR SELF CONVERGENCE DURING ERASE OF A NON-VOLATILE MEMORY DEVICE

BACKGROUND

1. Field of the Invention

The invention relates generally to non-volatile memory devices and more particularly to systems and methods for correcting an over-erase condition in a non-volatile memory cell.

2. Background of the Invention

Non-volatile memory devices, such as flash based memory devices, comprise a plurality of cells that can be electrically programmed and erased. Each cell generally represents a bit of information and cells are typically arranged into words, where each word comprises a certain number of bits. Each cell also typically comprises one or more transistors. In order to reduce the overall size of a non-volatile memory circuit, single transistor cells are often preferred. One well known type of single transistor cell used in conventional non-volatile memory devices makes use of a single transistor with a special construction known as a floating gate construction, and is referred to as a floating gate transistor.

There are three main operations performed on a flash cell, e.g., comprising a floating gate transistor. These operations are read, write, and erase. The write operation can also be referred to as a programming operation. Typically, a non-volatile memory device, e.g., a flash based memory device, is erased and then programmed with instructions or code. In operation, the code is then accessed and read by a device such as a processor. A flash cell can be read, written to, and erased by applying the appropriate voltages to the control gate, source, drain, and body, or substrate comprising, e.g., the floating gate transistor that makes up the cell.

A cell is programmed, for example, by applying a relatively high programming voltage to the control gate and a lower voltage to the drain. For example, conventional device often use a control gate voltage of 9-10 volts and a drain voltage of 5 volts during programming. The source voltage is typically maintained at ground, or 0 volts. The programming voltages are configured to create a relatively high voltage potential between the drain and source, which causes electrons to flow from source to drain through a channel in the substrate that links the two. Additionally, the relatively high voltage applied to the control gate raises the voltage potential of the floating gate, which resides below the control gate and above the channel. The floating gate is typically insulated from the substrate by a dielectric layer. Similarly, the floating gate is also insulated from the control gate by a dielectric layer. The high potential created on the floating gate attracts electrons flowing through the channel, causing them to "tunnel" through the dielectric layer separating the floating gate from the channel. This phenomenon is often referred to as hot carrier injection.

A successful programming operation results in injection of enough electrons onto the floating gate to achieve a desired threshold voltage (Vt) for the flash cell. The threshold voltage (Vt) is the voltage that must be applied to control gate to cause conduction through the channel during a read operation.

Upon removal of the programming voltages, the injected electrons are trapped on the floating gate, creating a negative voltage that must be overcome in order to effect a read. The threshold voltage (Vt) needed to overcome the negative effect of the injected electrons can for example be 4 volts; however, The threshold voltage (Vt) can vary by implantation. Moreover, as discussed below, the threshold voltage (Vt) can vary by cell due to process variations.

A cell is read by applying a read voltage to the control gate, and a lower voltage to the drain, while grounding the source. For example, a voltage of 5 volts can be applied to the control gate and a voltage of 1 volt to the drain. Current on the bit line (BL) is then sensed to determine whether the cell is programmed. If the cell is programmed and the threshold voltage (Vt) is relatively high, e.g., 4 volts, then the bit line (BL) current will be approximately 0 amps. If the cell is not programmed and the threshold voltage is relatively low, e.g., 2 volts, then the read voltage applied to the control gate will enhance the channel and the BL current will be relatively high.

A cell can be erased by applying a high voltage to the source, a lower voltage to the control gate, and allowing the drain to float. For example, a voltage of 16 volts can be applied to the source, while the control gate is grounded, or a lower voltage, such as 5 volts can be applied to the source, while a negative voltage, such as 10 volts, is applied to the control gate. This causes the electrons injected onto the floating gate to undergo a phenomenon known as Fowler-Nordheim tunneling from the floating gate, through the dielectric layer separating the floating gate from the channel, and to source. In addition, the channel is also erased by letting the drain and source float and applying an erase voltage to the control gate.

A problem with conventional non-volatile memory devices is that the manufacturing variances can cause some cells to become "over-erased" before other cells are sufficiently erased. In over-erased cells, the floating gate has a very low negative charge, or even a positive charge. An over-erased cell can act as a depletion mode transistor that cannot be turned off by normal operating voltages. Thus, an over-erased cell will have an associated leakage current that can prevent accurate reads of not just the over-erased cell, but other cells coupled with the same BL.

Conventional non-volatile memory devices implement a variety of techniques to correct over-erased cells. For example, some conventional device use a process referred to as soft-programming; however, soft-programming and other conventional solutions can be inefficient because they require extra circuitry and can significantly increase the time associated with the erase cycle. As a result, such conventional solutions may not be sufficient for certain applications that require fast erase cycles and reduced complexity.

SUMMARY

A non-volatile memory device implements self-convergence during the normal erase cycle through control of physical aspects, such as thickness, width, area, etc., of the dielectric layers in the gate structure as well as of the overall gate structure.

In one aspect, self-convergence is aided during the normal erase cycle by ramping the erase voltage applied to the control gate during the erase cycle.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

Figure 1:
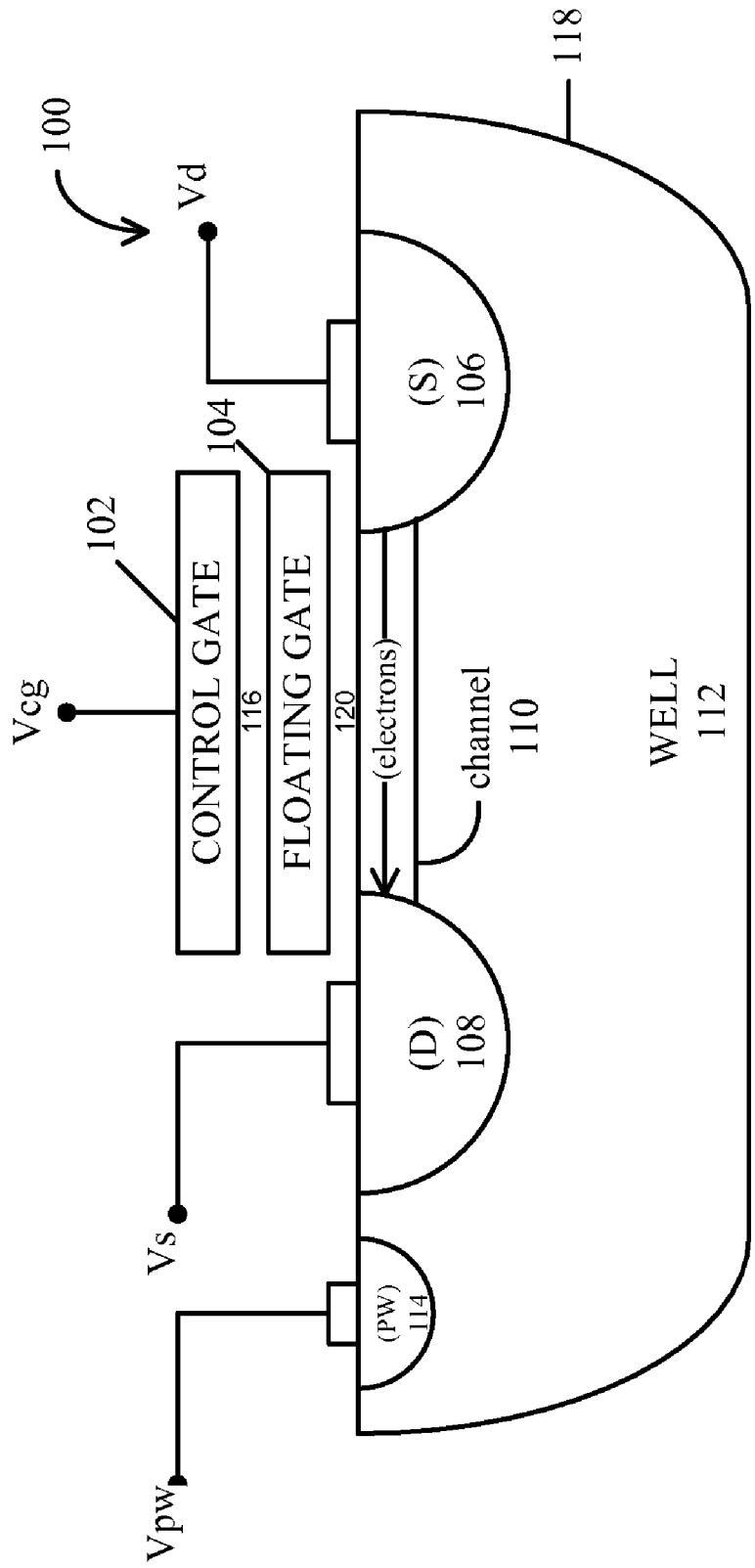
FIG. 1 is a diagram illustrating a non-volatile memory cell in accordance with one embodiment.

FIG. 1 is a diagram illustrating a floating gate transistor 100 that can comprise a cell in a non-volatile memory device. As can be seen, floating gate transistor 100 comprises a stacked gate configuration above a silicon substrate 118. The stacked gate configuration comprises a control gate 102 stacked above a floating gate 104, which is in turn above the silicon substrate 118. The gates 102 and 104 are often constructed from polysilicon material and are separated by dielectric layers 116 and 120. Layer 120 separating floating gate 104 from substrate 118 can be a dielectric layer, such as an oxide layer, while layer 116 separating floating gate 104 from control gate 102 can be a dielectric stack structure, such as an oxide-nitride-oxide layer (ONO) layer.

A drain (D) region 108 and source (S) region 106 are formed within a well 112 in silicon substrate 118. It will be understood that the drain 108 and source 106 regions are of opposite doping relative to well 112. For example, if drain 108 and source 106 are N-type regions, then well 112 will be a P-type region. In triple well configurations, a second well surrounding well 112 can also be included in silicon substrate 118. The region of silicon substrate 118 below floating gate 104 is referred to as the channel region, or channel 110. As with many conventional devices, floating gate transistor 100 is formed on top of a p-type substrate or p-well 112 and source and drain regions are N-type regions. Floating gate transistor 100 can also include a P-well connection region (PW) 114.

FIG. 1 also illustrates various leads configured to interface various voltages with floating gate transistor 100. These voltages are designated as Vpw, Vs, Vcg, and Vd.

In the systems and methods described herein, a process known as self-convergence can be used during the erase cycle in order to correct for an over erased condition for transistor 100. In a self-convergence erase process, positive charge left on floating gate 104 as a result of an over erase condition can be removed by creating a lateral field in channel 110 between source 106 and drain 108, while at the same time creating a transient vertical field on floating gate 104. The vertical field induced on floating gate 104 assists hot carriers generated by the lateral field created between source 106 and drain 108 to be injected into floating gate 104.

This process is self-correcting, because the over erased correction effect is weaker when floating gate 104 has not been over erased and the correction effect is stronger when floating gate 104 has been over erased. This is because the charge remaining on floating gate 104 affects the net transient vertical field induced on floating gate 104. Thus, a cell 100 that has not been over erased will not produce a very strong transient vertical field and the correction will be minimal. Conversely, when a cell 100 has been over erased, the transient vertical field will be stronger and the correction effect will be greater. This self-correcting nature of the process described is referred to as self-convergence, because all cells will converge to a positive threshold voltage automatically and in very little additional time. Further, little or no additional circuitry is required to produce the self-convergence effect.

Figure 2:
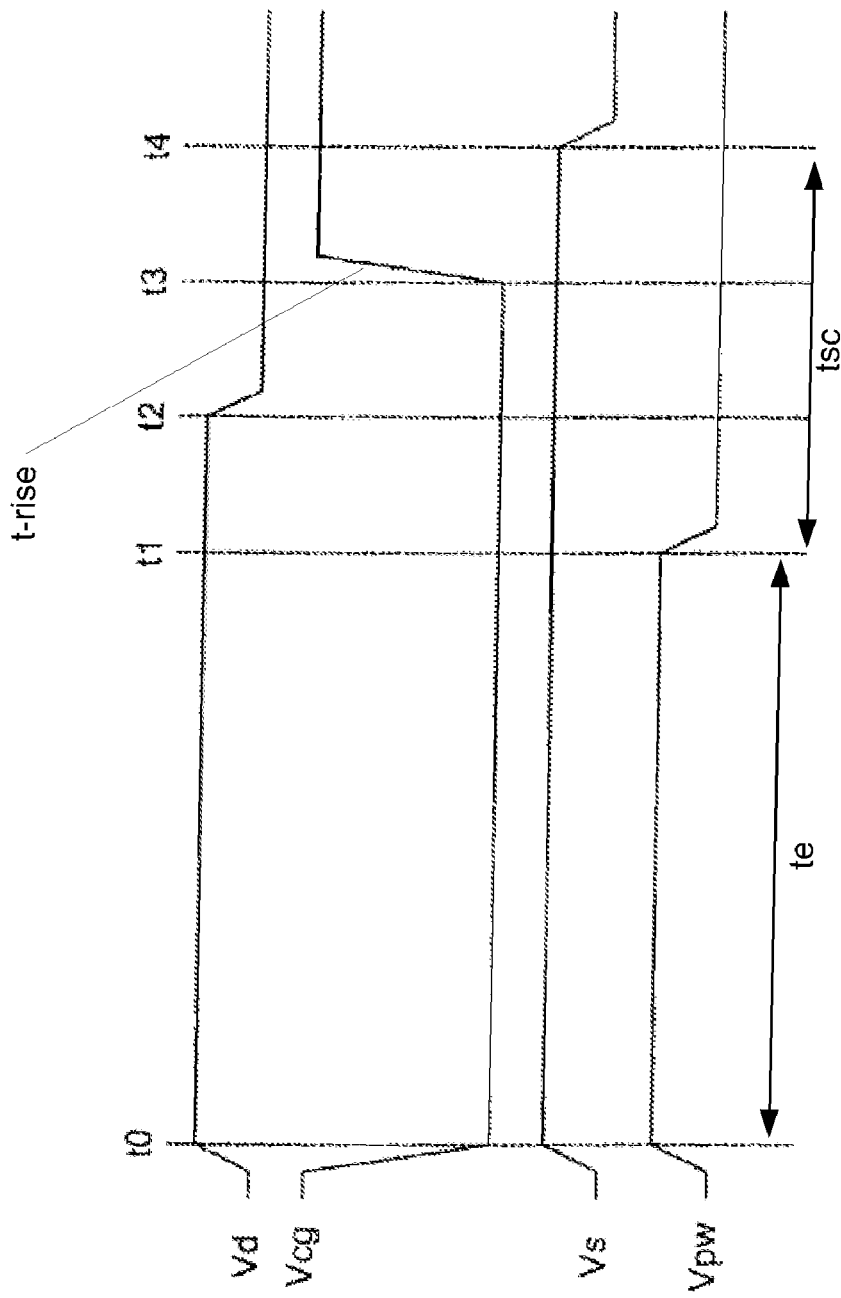
FIG. 2 is a timing diagram illustrating various voltage waveforms applied to each cell of FIG. 1 during an erase cycle.

FIG. 2 is a timing diagram illustrating wave forms and timing for various voltages applied to floating gate transistor 100 during a self-convergence erase cycle. As can be seen, the timing diagram of FIG. 2 is divided into an erase period (te) and a self-convergence period ($t_{SC}$). During the self-convergence period ($t_{SC}$), the drain voltage (Vd) and the source voltage (Vs) must be controlled in order to create a lateral transient field between source 106 and drain 108. In addition, the control gate voltage (Vcg) should be controlled during the self-convergence period ($t_{SC}$) so as to create a transient vertical field on floating gate 104 while the lateral field exists between source 106 and drain 108.

As can be seen, the erase period (te) begins at time t0 with Vd, Vs, and Vpw transitioning to a high voltage, while Vcg transitions to a negative voltage. These voltages remain at these levels throughout the erase period (te) which ends at time t1. Time t1 marks the beginning of the self-convergence period ($t_{SC}$). At a time t2 after t1, Vd transitions back to 0 volts, while Vs remains at a high voltage. This creates a differential bias on source 106 relative to drain 108 that creates a lateral field within channel region 110.

At time t3 following t2, Vcg can be allowed to transition back to 0 volts. This creates a transient vertical voltage on floating gate 104, while the lateral field exists in channel region 110. This vertical field assists hot carriers generated by the lateral field to be injected from channel region 110 into floating gate 104. This results in the over erased correction described above. Again, this correction is self-converging because the cell's threshold voltage will automatically converge to a positive non-zero value.

Because each of the voltages illustrated in FIG. 2 must return to their initial values anyway, little or no additional time is needed for self-convergence period ($t_{SC}$) relative to a typical erase cycle.

Figure 5:
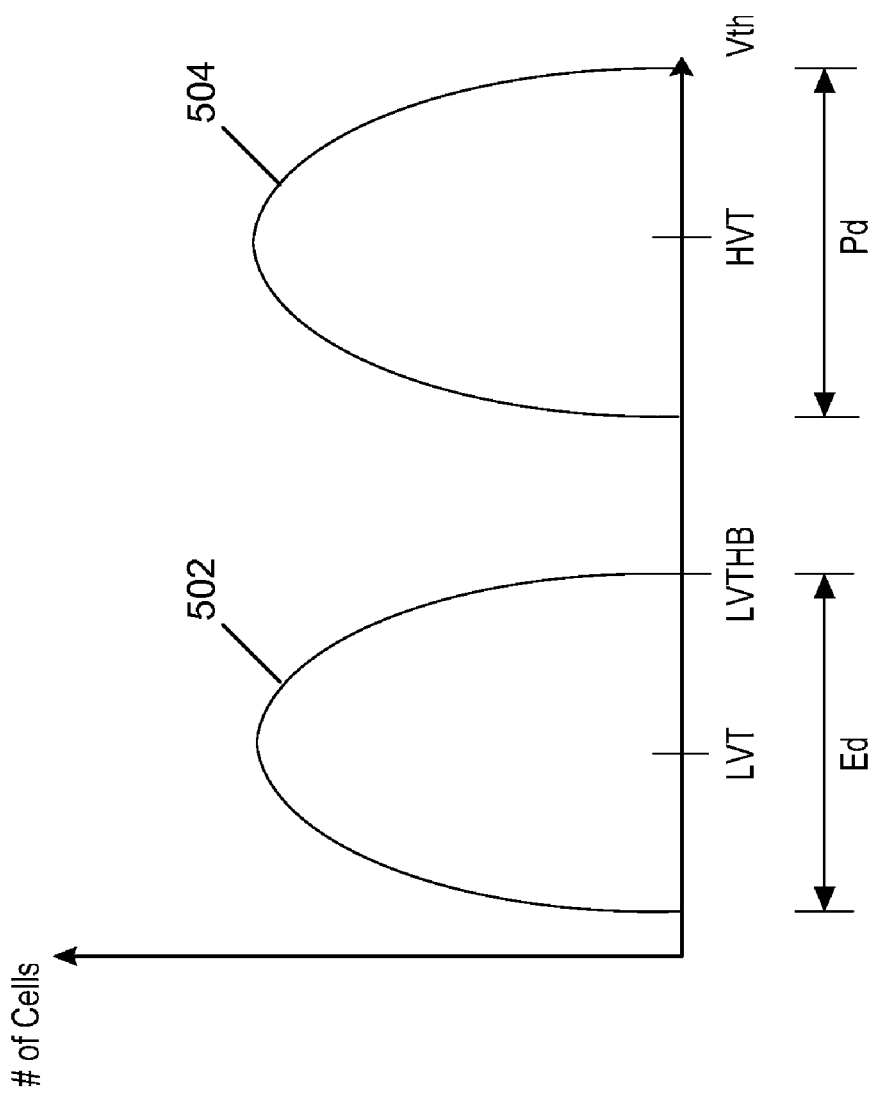
FIG. 5 is a diagram illustrating an exemplary low threshold voltage distribution and a high threshold voltage distribution.

In practice, it can be difficult to control the transient response efficiently to achieve an adequate erase threshold voltage distribution. FIG. 5 is a diagram illustrating a programmed voltage distribution 504 and an erase voltage distribution 502 for a plurality of cells 100. Thus, when erased the cells will have a low threshold voltage and when programmed the cells will have a high threshold voltage. The distribution 502 for the low threshold voltage for the cells can be depicted as being centered around a mean threshold voltage (LVT) and will form a bell curve over the range $E_d$. Similarly, the distribution 504 of high threshold voltages for the plurality of cells can be depicted as a bell-shaped curve centered at a medium high threshold voltage (HVT) over a range $P_d$. It is important to control the range $E_d$ over which the low threshold voltage distribution 502 extends. If the voltage at the high end of the range, which can be referred to as the low threshold voltage high bound (LVHB) is too high, then it can be difficult to detect whether the cells near LVHB are in fact erased, or whether they are programmed. Thus, it is important to control the low threshold voltage distribution 502 in order to ensure that it has a sufficiently narrow range $E_d$.

Because the transient effect used during the self-convergence period ($t_{SC}$) described above can be difficult to control, it is not always possible to achieve a sufficiently narrow low threshold voltage distribution. Control of the low threshold voltage distribution can be achieved, however, by controlling the current in dielectric layers 116 and 120 in order to balance the erase current produced during erase.

The dielectric currents can be controlled, for example, by controlling aspects related to the physical structure of the layers and/or of the gate structure. These aspects can include thickness, width, area, etc. These various aspects can be adjusted in order to create dielectric currents that offset the current generated during the erase cycle so as to ensure that all cells self-converge to a certain threshold voltage (Vth). Because these aspects can be controlled with sufficient precision, the erase Vth, or LVT, for a cell can be precisely controlled. This produces a narrow LVT distribution.

Figure 3:
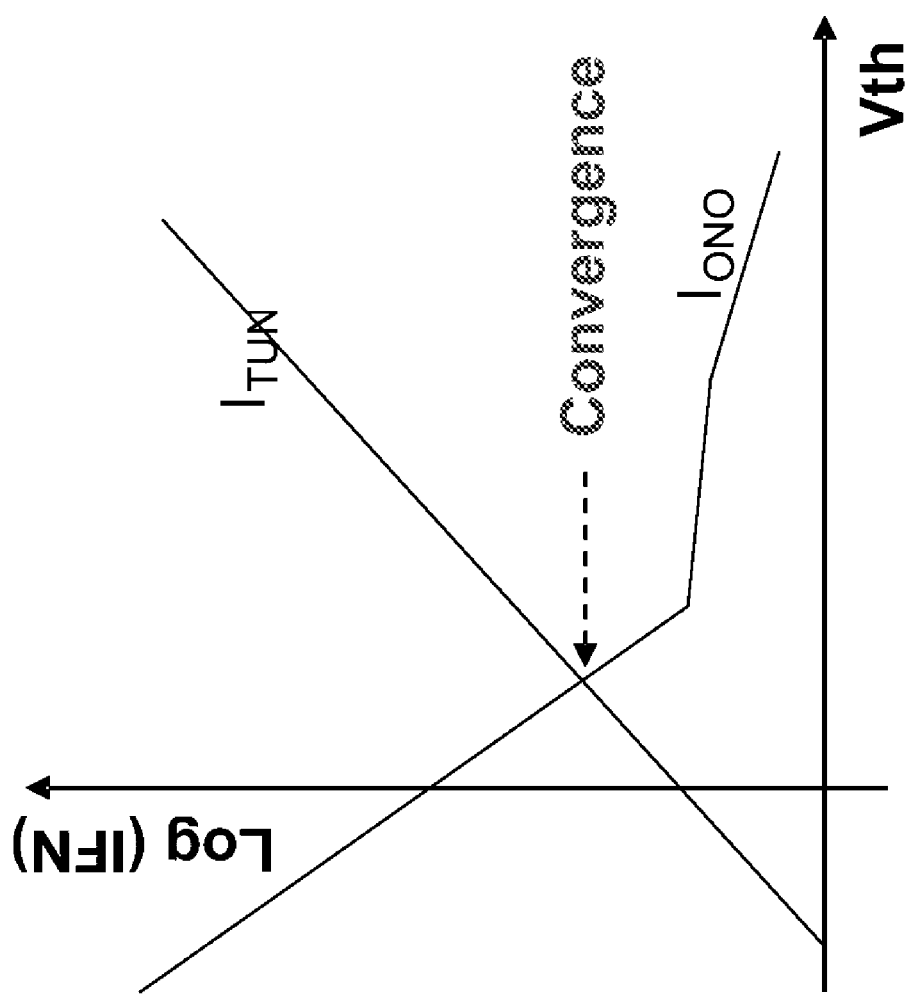
FIG. 3 is a diagram illustrating how dielectric current can be controlled in order to achieve self convergence at a selected threshold voltage for the cell of FIG. 1 in accordance with one embodiment.

For example, in one embodiment in which dielectric layer 116 is an ONO layer, FIG. 3 illustrates how the ONO current ($I_{ONO}$) and current in the tunnel layer 120 ($I_{TUN}$) can be controlled so as to achieve convergence at a target Vth. In other words, $I_{ONO}$ and $I_{TUN}$ can be controlled until they are substantially the same, thereby overcoming the over erased problem. In the example of FIG. 3, the selected Vth for self-convergence was achieved by controlling the Gate Coupling Ratio (GCR) for the cell, e.g., by controlling the ratio of the tunnel (TUN) oxide layer 120 and ONO layer 116 thicknesses. In one specific embodiment, the ONO/TUN effective thickness can be equal to about 0.8≈1.4, with ONO and tunnel oxide areas of about 3.0≈0.8. Further, the ONO layer effective thickness can be less than approximately 130 Å.

In addition, the erase voltage applied to the control gate (Vcg) can be configured to ramp during the erase cycle so as to aid in self-convergence. In other words, by ramping Vcg during the erase period, less charge will be removed from floating gate 104 which will help prevent over-erase.

By implementing self-convergence through control of the physical aspects of the dielectric layers and gate structure, no extra time is required during the erase cycle. Thus, this approach is extremely fast and efficient. Further, Vcg can be ramped during the erase cycle in order to aid self convergence, without adding any additional time to the erase cycle. Because these aspects can be controlled sufficiently, a precise Vth can be achieved as well as a narrow LVT distribution.

Figure 4:
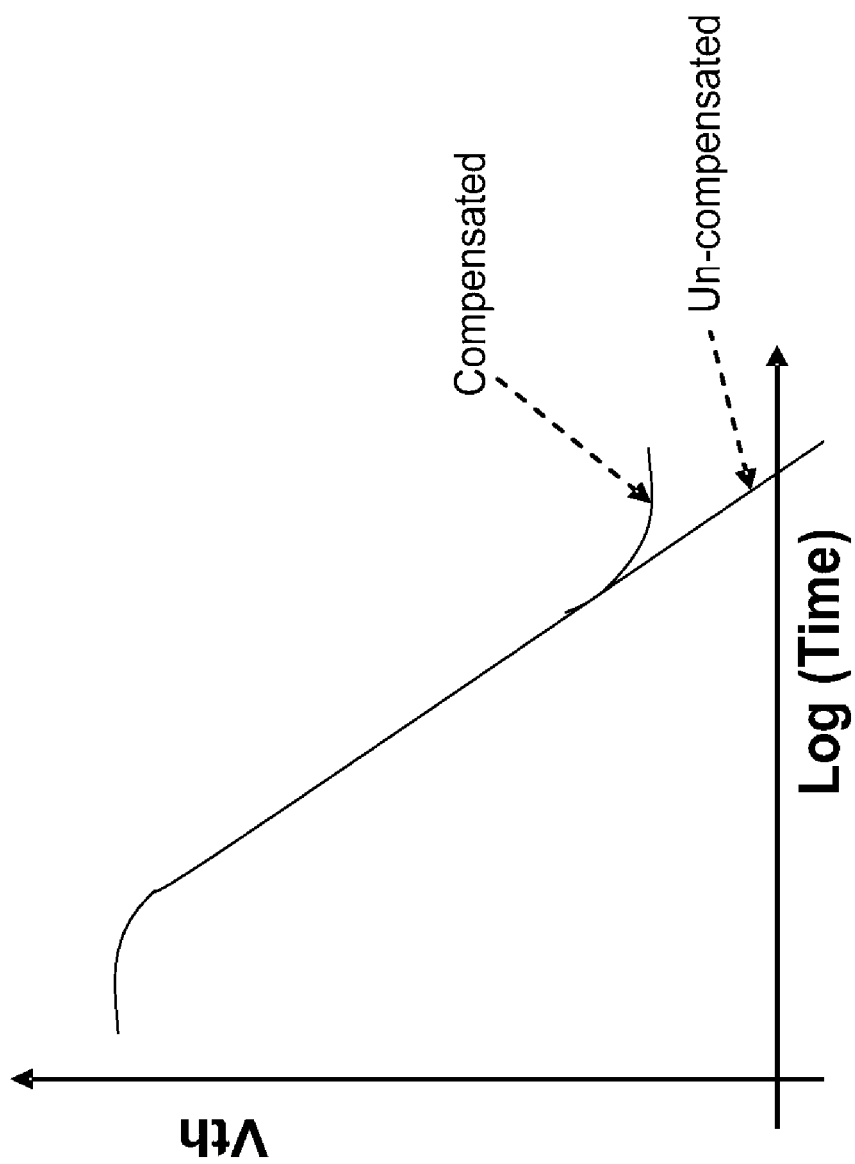
FIG. 4, is a diagram illustrating the effect of the self convergence achieved using the process illustrated in FIG. 3.

FIG. 4 is a diagram illustrating the post erase threshold voltage for a cell that uses the self-convergence compensation scheme just described and for a cell that does not. As can be seen, the cell that uses the self convergence scheme described self converges to a positive Vth, whereas the cell that does not use the scheme can be over-erased.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A method for making a non-volatile memory device including a plurality of cells, each cell including a floating gate transistor and a threshold voltage, comprising:
    selecting a dimension related to a physical aspect for a first dielectric layer in a gate structure of each floating gate transistor included in the plurality of cells so as to ensure that the current in the first dielectric layer is substantially similar to the current in a second dielectric layer once the threshold voltage is substantially similar to a predetermined value when a voltage is applied to each floating gate transistor included in the plurality of cells; and
    controlling the fabrication of the non-volatile memory device to achieve the selected dimension for the dielectric layer for each floating gate transistor included in the plurality of cells.

2. The method of claim 1, wherein the physical aspect is a thickness for the first dielectric layer.

3. The method of claim 1, wherein the physical aspect is a width for the first dielectric layer.

4. The method of claim 1, wherein the physical aspect is an area for the first dielectric layer.

5. The method of claim 1, wherein the physical aspect is a thickness ratio for the first dielectric layer in relation to the second dielectric layer.

6. The method of claim 1, wherein the first dielectric layer is an ONO layer between a floating gate and a control gate of each transistor of the plurality of cells.

7. The method of claim 1, wherein the second dielectric layer is a tunnel layer between a floating gate and a body of each transistor of the plurality of cells.

8. The method of claim 1, wherein the physical aspect is a thickness for the first dielectric layer, and wherein the thickness is about 130 Å.

9. The method of claim 1, wherein the physical aspect is an area ratio of the first dielectric layer in relation to the second dielectric layer, and wherein the area ratio is about 3.0≈0.8.

10. The method of claim 1, wherein the physical aspect is a thickness ratio for the first dielectric layer in relation to a second dielectric layer, and wherein the ratio is about 0.8≈1.4.

11. The method of claim 1, wherein the dimension is selected to control the Gate Coupling Ratio (GCR) for each floating gate transistor included in the plurality of cells.

12. A non-volatile memory device comprising a plurality of cells, each cell comprising a transistor configured to implement a self convergence, each transistor comprising a gate structure, the gate structure comprising:
    a body;
    a control gate;
    a floating gate;
    a dielectric layer between the control gate and the floating gate; and
    a tunnel dielectric layer between the floating gate and the body, the dimensions of at least one of the dielectric layer and the tunnel dielectric layer selected to control the current in the dielectric and tunnel dielectric layers so that the currents in each are substantially the same when a voltage is applied to each transistor.

13. The non-volatile memory device of claim 12, wherein the dielectric layer is an ONO layer.

14. The non-volatile memory device of claim 12, wherein the physical aspect is a thickness.

15. The non-volatile memory device of claim 12, wherein the physical aspect is a width.

16. The non-volatile memory device of claim 12, wherein the physical aspect is an area.

17. The non-volatile memory device of claim 12, wherein the physical aspect is a thickness ratio for the dielectric layer in relation to the tunnel dielectric layer.

18. The non-volatile memory device of claim 14, wherein the physical aspect is a thickness of the ONO dielectric layer, and wherein the thickness of the ONO dielectric layer is about less than 130 Å.

19. The non-volatile memory device of claim 12, wherein the physical aspect is an area ratio of the dielectric layer in relation to the tunnel dielectric layer, and wherein the area ratio is about 3.0≈0.8.

20. The non-volatile memory device of claim 12, wherein the physical aspect is a thickness ratio for the dielectric layer in relation to the tunnel dielectric layer, and wherein the ratio is about 0.8≈1.4.

* * * * *